United States Patent [19]

Endlicher et al.

[11] 4,380,755

[45] Apr. 19, 1983

[54] MONOLITHICALLY INTEGRATED TWO-DIMENSIONAL IMAGE SENSOR WITH A DIFFERENCE FORMING STAGE

[75] Inventors: Frank Endlicher, Munich; Rudolf Koch, Germering, both of Fed. Rep. of Germany

[73] Assignee: Siemens Aktiengesellschaft, Berlin & Munich, Fed. Rep. of Germany

[21] Appl. No.: 164,300

[22] Filed: Jun. 30, 1980

[30] Foreign Application Priority Data

Sep. 28, 1979 [DE] Fed. Rep. of Germany ....... 2939490

[51] Int. Cl.$^3$ .............................................. H04N 5/30
[52] U.S. Cl. ..................................... 382/68; 358/167;
358/213; 357/24; 357/30
[58] Field of Search ............... 358/213, 167, 177, 212;
357/24, 30–32; 364/574; 328/162, 165;
307/520, 529; 340/146.3 F, 146.3 MA;
250/208, 211 J, 211 R

[56] References Cited

U.S. PATENT DOCUMENTS

| | | | |
|---|---|---|---|
| 3,856,989 | 12/1974 | Weimer | 358/213 |
| 3,946,151 | 3/1976 | Kamiyama et al. | 358/213 |
| 4,001,501 | 1/1977 | Weimer | 358/167 |
| 4,067,046 | 1/1978 | Nakatani et al. | 358/167 |
| 4,145,721 | 3/1979 | Beaudovin et al. | 358/167 |
| 4,167,755 | 9/1979 | Nagumo | 358/167 |
| 4,169,273 | 9/1979 | Hendrickson | 358/213 |
| 4,189,749 | 2/1980 | Hiroshima et al. | 358/167 |
| 4,220,976 | 9/1980 | Koch | 358/213 |
| 4,288,815 | 9/1981 | Miles | 358/167 |
| 4,317,134 | 2/1982 | Woo et al. | 358/167 |

FOREIGN PATENT DOCUMENTS

2611771 9/1977 Fed. Rep. of Germany .
2642166 3/1978 Fed. Rep. of Germany .

*Primary Examiner*—Leo H. Boudreau
*Attorney, Agent, or Firm*—Hill, Van Santen, Steadman, Chiara & Simpson

[57] ABSTRACT

A monolithically integrated two-dimensional image sensor having an array of sensor elements disposed in rows and columns connected by respective row and column lines. A first readout of the sensor elements is undertaken and a charge packet representing the signal is formed by an oppositely doped semiconductor region connected to the respective column lines which charge packet contains charge carriers generated as a result of incident radiation as well as noise signals. A second readout of the sensor elements is undertaken for a short duration so that the charge packet generated as a result of the second readout represents only noise signals. A difference-forming stage connected to the image sensor has a storage capacitor associated with each column line for subsequently storing the two signals such that the voltage at the capacitor is displaced from a reference potential in an amount representing the difference between the two signals which thus provides a signal to a serial output device such as a charge transfer device which represents only charge carriers generated by incident radiation and is substantially noise-free. The capacitors are connected to a reset device for preparing the difference-forming stage for the next readout sequence.

8 Claims, 5 Drawing Figures

MONOLITHICALLY INTEGRATED TWO-DIMENSIONAL IMAGE SENSOR WITH A DIFFERENCE FORMING STAGE

BACKGROUND OF THE INVENTION

1. Field of the Invention

The present invention relates to monolithically integrated two-dimensional image sensors with sensor elements arranged in rows and columns on a semiconductor substrate and in particular to such an image sensor with a difference-forming stage for undertaking sequential readouts of the sensor elements to generate a substantially noise-free signal.

2. Description of the Prior Art

A monolithically integrated two-dimensional image sensor in which the sensor elements are arranged in rows and columns on a doped semiconductor body is known from German AS No. 26 11 771. Each sensor element in a respective column is connected by a common column line which represents a readout line for the sensor signals from the elements in that column. Each column line is connected to an input of a readout device which has a number of outputs for sequential readout of the sensor signals. The image sensor further has a difference-forming stage for determining the difference between signals representing incident radiation plus noise and signals representing substantially noise alone so that a final signal can be generated which corresponds only to charge carriers generated by radiation incident on the sensor elements. The difference-forming stage known from German AS No. 26 11 771 undertakes a double sampling of the voltage signals and requires a relatively large surface area on the semiconductor substrate and can only be co-integrated on the substrate with other circuit components with substantial difficulty.

Another circuit for undertaking a difference-formation of electrical charges integrated on a semiconductor body is known from German OS No. 28 11 146 in which the charges to be measured are successively transferred in a charge coupled arrangement into a capacitor formed by an electrode with a freely adjustable potential disposed above the semiconductor body, and the charges are removed therefrom with the corresponding potential difference being measured at the electrode. Employment of this circuit as a readout means for a two-dimensional image sensor would require simultaneous transfer of the total sensor signals and the noise signals which would also require a substantial surface area outlay on the semiconductor body.

Sensor elements of the type which may be used in the invention disclosed herein are known, for example, from the text by P. G. Jespers entitled "Solid State Imaging", Noordhof Int. Publishing, Leyden, The Netherlands at pages 447 through 461 as well as a publication by S. Ohba entitled "A 1,024 Element Linear CCD and Sensor With a New Photodiode Structure", Proceedings IEDM 1977, Washington, at pages 538 through 541.

The basic structure and operation of all types of charge transfer device arrangements which may be used within the context of the inventive concept disclosed herein are known, for example, from the text by Sequin and Tompsett entitled "Charge Transfer Devices", Academic Press, New York, 1975 at pages 1 through 18.

SUMMARY OF THE INVENTION

It is an object of the present invention to provide a difference-forming stage for a monolithically integrated two-dimensional image sensor which requires a relatively small semiconductor surface area.

It is a further object of the present invention to provide such a difference-forming stage which is operable in a time frame corresponding to the standard scanning and blanking periods in commercial television devices.

The above objects are inventively achieved in a difference-forming stage for a two-dimensional image sensor in which successive readout signals are received from a sensor array having sensor elements disposed in rows and columns and are transferred into a difference-forming stage having a plurality of storage capacitors respectively associated with each sensor element column.

The sensors are subjected to a first readout operation occurring over a relatively long period and a charge packet is generated in an oppositely doped semiconductor region which arises from charge carriers resulting not only from radiation incident on the sensor elements but also from noise inherent in the sensor, a so-called "zero signal."

The charge packet generated by the first readout operation is transferred beneath a transfer gate supplied with a clock pulse voltage into a storage capacitor associated with the column containing the sensor element. The storage capacitor at this time being kept at a reference potential. Subsequently, the storage capacitor is brought into a floating condition and the said charge packet is transferred from the storage capacitor to another oppositely doped semiconductor region. Then the second readout operation takes place. The second charge packet, representing the zero signal, is then also transferred beneath the transfer gate into the storage capacitor, the latter being in a floating condition, causing a corresponding voltage drop so that the potential appearing at an external electrode of the storage capacitor represents the difference between the first and second charge packets and thereby corresponds to only charge carriers generated as a result of radiation incident on the sensor elements and is essentially noise-free.

This charge packet is transferred into a serial output device such as a charge transfer device which transfers the signal, as well as similar signals received from other sensor element columns, to an output stage for further processing. A reset means which may consist of a series of gate-controlled transistors respectively connected to each column line or may consist of another oppositely doped semiconductor region and another transfer gate, are supplied for resetting the difference forming stage to accept the next readout sequence from the sensor elements.

DESCRIPTION OF THE PREFERRED EMBODIMENTS

Figure 1:
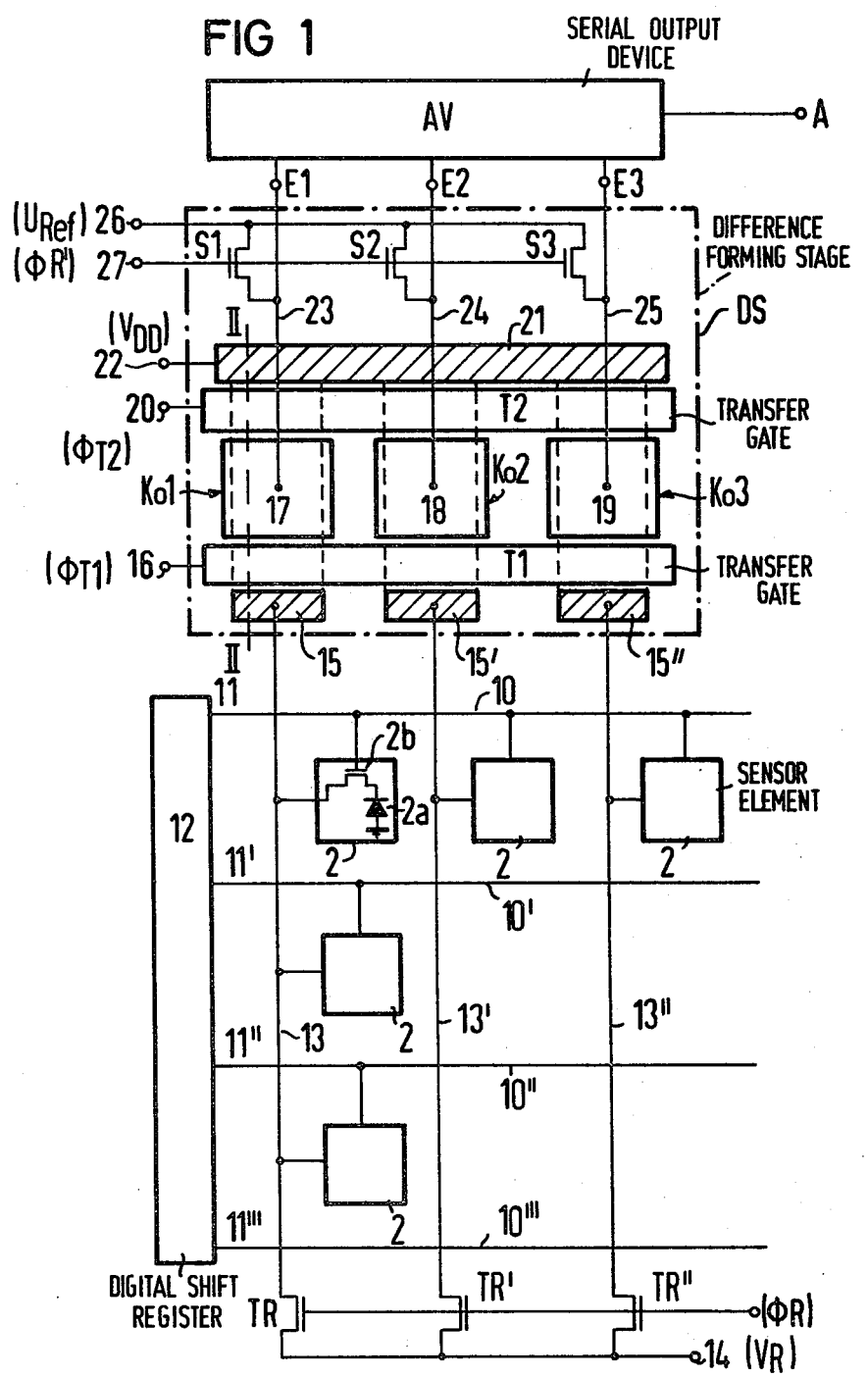
FIG. 1 is a schematic circuit diagram of a two-dimensional image sensor with a difference-forming stage constructed in accordance with the principles of the present invention.
Figure 2:
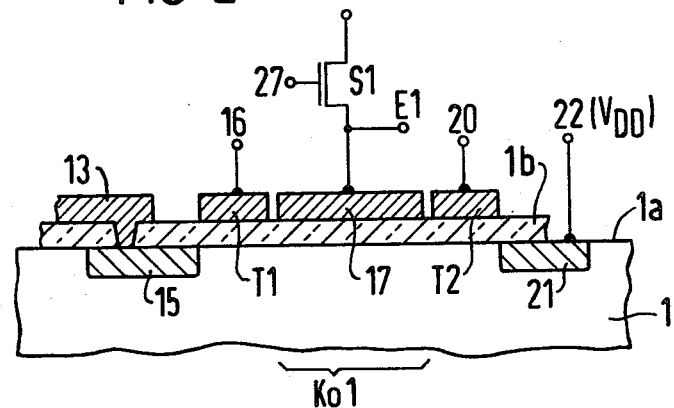
FIG. 2 is a sectional view taken along line II—II of FIG. 1.

A monolithically integrated circuit having a two-dimensional image sensor and an associated difference-forming stage DS is shown in FIG. 1. The circuit is monolithically integrated on a doped semiconductor body 1, shown in FIG. 2, which may, for example, consist of p-conductive silicon. The circuit contains a plurality of sensor elements 2 which are arranged on the semiconductor body 1 in rows and columns. A portion of such sensor elements 2 is represented in FIG. 1, however, it will be understood that generally image sensors of this type contain one or more sensor elements per row and column. Each sensor element in a first row are connected to a common row line 10 which is in turn connected to an output 11 of a digital shift register 12. Similarly, a common row line 10' for the next row is connected to an output 11' of the digital shift register 12, and so on for the succeeding common row lines 10" and 10''', respectively connected to outputs 11" and 11'''. By each output 11 through 11''', all elements in a row associated therewith are simultaneously selectable.

Each sensor column has associated therewith a column line which is represented at 13 for the first column, 13' for the second column, 13" for the next column and so on. Each column line is connected to an associated transistor TR, TR', and TR", each having a gate electrode connected to a common clock pulse voltage $\phi R$, and which are connected through their respective source-drain segments to a terminal 14 at which a reference potential is supplied. The column lines 13, 13', and 13" are respectively connected to regions 15, 15', and 15" which have a conductivity opposite to that of the semiconductor body 1 and lie at the boundary surface 1a thereof. The area of the semiconductor body 1 disposed adjacent to the regions 15 through 15" is covered by a first transfer gate T1 having a terminal 16 which is separated from the boundary surface 1a of the semiconductor body by a thin insulating layer 1b, shown in FIG. 2, which may consist, for example, of silicon dioxide.

The sensor elements 2 may consist, for example, of photodiodes 2a, as schematically represented in FIG. 1, with each photodiode 2a being connected to the associated column line, such as 13, through the source-drain segment of a field effect transistor 2b. The gate of the transistor 2b is connected to the corresponding row line, such as 10. The sensor elements 2 may alternatively be comprised of metal-insulator-semiconductor (MIS) capacitors or may be a charge injection device (CID) sensor which has two MIS capacitors disposed adjacent to each other. Any other suitable type of sensor element known to those skilled in the art may be utilized without departing from the inventive concept herein. Utilization of photodiodes is, however, most preferable from the standpoint of achieving a uniform spectral sensitivity.

External electrodes 17, 18 and 19 of respective capacitors Ko1, Ko2 and Ko3 are disposed on the semiconductor substrate 1 next to the transfer gate T1. A transfer gate T2 which is supplied at a terminal 20 with a clock pulse voltage $\phi_{T2}$. The transfer gate T2 is also separated from the boundary surface 1a by the insulating layer 1b.

An oppositely doped semiconductor region 21 is disposed on the opposite side of the transfer gate T2 in the lateral direction and is connected at a terminal 22 to an operating voltage $V_{DD}$. The external electrodes 17, 18 and 19 of the capacitors Ko1, Ko2 and Ko3 are respectively connected via lines 23, 24, and 25 to inputs E1, E2 and E3 of a serial output device AV. The serial output device AV sequentially reads out signals from the difference-forming stage DS and provides a serial output signal at an output A.

The electrodes 17 through 19 are further connected to a reset means for resetting the electrodes to a reference voltage $U_{Ref}$ and also serves to disconnect the electrodes 17 through 19 from external potentials, that is, placing the electrodes in a floating state. In FIG. 1 the reset means consists of field effect transistors S1, S2 and S3 having their respective drain-source segments connected from the lines 23, 24 and 25 to a terminal 26 at which the potential $U_{Ref}$ is supplied. Each transistor S1, S2, and S3 has a gate electrode connected to a common terminal 27 at which a clock pulse voltage $\phi R'$ is supplied.

Readout of information from the device shown in FIG. 1 begins with a resetting of the column lines 13, 13' and 13" to the reference potential $V_R$ by switching the transistors TR, TR' TR" to a conducting state by the clock pulse voltage $\phi R$. Upon the termination of the pulse at the gates of those transistors, the transistors become again non-conducting so that the column lines are disconnected from external potentials and are in a floating state. The transistors 2b of one of the rows 10, 10' or 10" selected by the digital shift register 12 are then switched to a conducting state and optically generated charge carriers resulting not only from radiation incident on the individual sensor elements 2 but also resulting from noise characteristics of those elements now flow on the column lines to the oppositely doped regions 15, 15' and 15". The transistors 2b are subsequently again switched to a non-conducting state.

Further operation of the circuit shown in FIG. 1 will be undertaken with reference to the left-most column of sensor elements, however, it will be understood that identical operational sequences are occurring simultaneously for each sensor column. A charge packet from the first readout operation generated by the oppositely doped region 15 as a result of the change in potential on the column lines 13 is transferred from the region 15 in the semiconductor zone indicated by the dashed lines beneath the transfer gate 16 by the application of a clock pulse $\phi_{T11}$ thereto into the capacitor Ko1.

Figure 3:
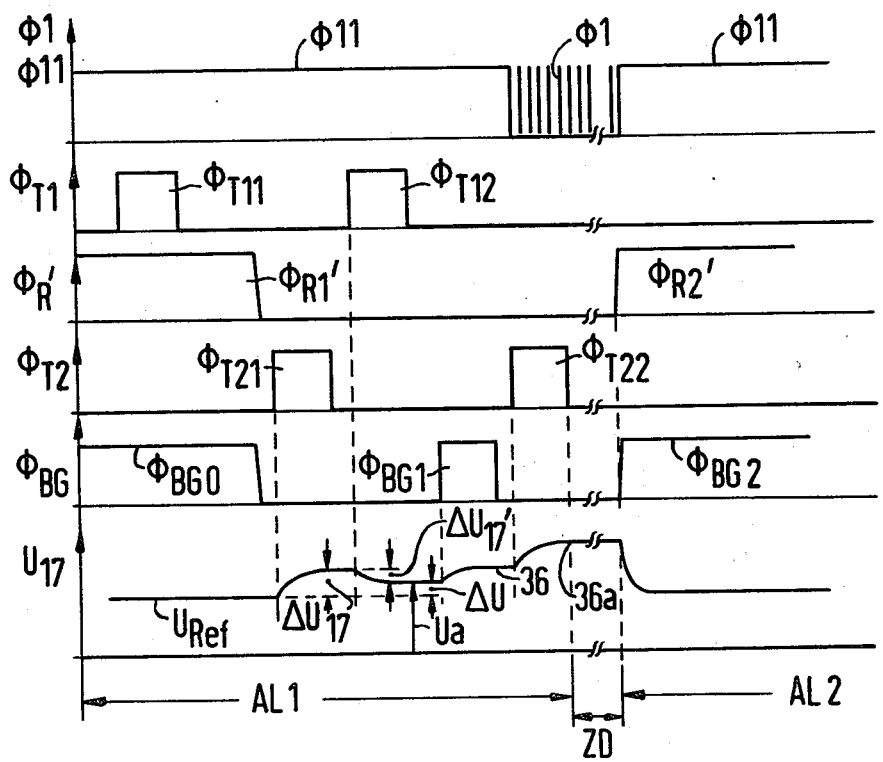
FIG. 3 is a voltage/time diagram for the various clock voltages for the operation of the circuits shown in FIGS. 1, 2 and 4.

As shown in FIG. 3, the voltage $U_{17}$ of the capacitor electrode 17 at the time of entry of the first charge packet beneath that electrode, is held at the value $U_{Ref}$ because of the clock pulse $\phi R1$, connected to the control electrode of the transistor S1, thereby maintaining that transistor in a conducting state between terminal 26 and the line 23. At the termination of the pulse $\phi_{R1'}$, the transistor S1 becomes non-conducting and the first charge packet beneath the electrode 17 is transferred into the oppositely doped semiconductor region 21 by the application of a clock pulse $\phi_{T21}$ to the second transfer gate T2. Again, transfer occurs in the semiconductor region indicated by the dashed lines. As a result, the voltage $U_{17}$ is increased by an amount $\Delta U_{17}$.

Subsequently the same sensor elements previously subjected to a readout operation, that is, those in whichever row is selected by the digital shift register 12, are subjected to a second readout operation which is undertaken in a manner such that as few as possible optically generated charge carriers are collected in the sensor elements 2 during the operation. This may be achieved, for example, by a very short dimensioning of the time between the first and second readout operations, so that the signals obtained from the second readout operation are essentially exclusively attributable to disruptive influences within the sensor elements 2 such as, for example, differences in the characteristic value of the individual partial circuits with respect to one another, to couplings of the clock pulse voltages employed for operation, to temperature effects, and the like. Such disruptions are known as "fixed pattern noise", and the signal generated during the second readout operation is known as the "zero signal." A second charge packet is generated by the oppositely doped region 15 as a result of the second readout operation in the same manner as occurred during the first readout operation. This second charge packet is transferred into the capacitor Ko1 beneath the first transfer gate T1 by the occurrence of a pulse $\phi_{T12}$ at the terminal 16.

Upon the introduction of the second charge packet into the semiconductor region beneath the electrode 17, a voltage drop $\Delta U17'$ occurs at the electrode 17. A voltage $U_a$ is thus present on the connection line 23 having a difference $\Delta U$ with respect to $U_{Ref}$ which corresponds to the difference between the first and second charge packets and thus represents an essentially noise-free sensor signal which represents only radiation incident on the sensor elements.

The corrected sensor signal is supplied to the input E1 of the serial output device AV and is read out in a prescribed chronological sequence at the output A together with the corrected sensor signals pending at the other inputs E2 and E3. At the beginning of the next readout operation, a pulse again occurs at the terminal 27 to switch the transistor S1 to a conducting state so that the electrode 17 is reset to the reference potential $U_{Ref}$.

Figure 4:
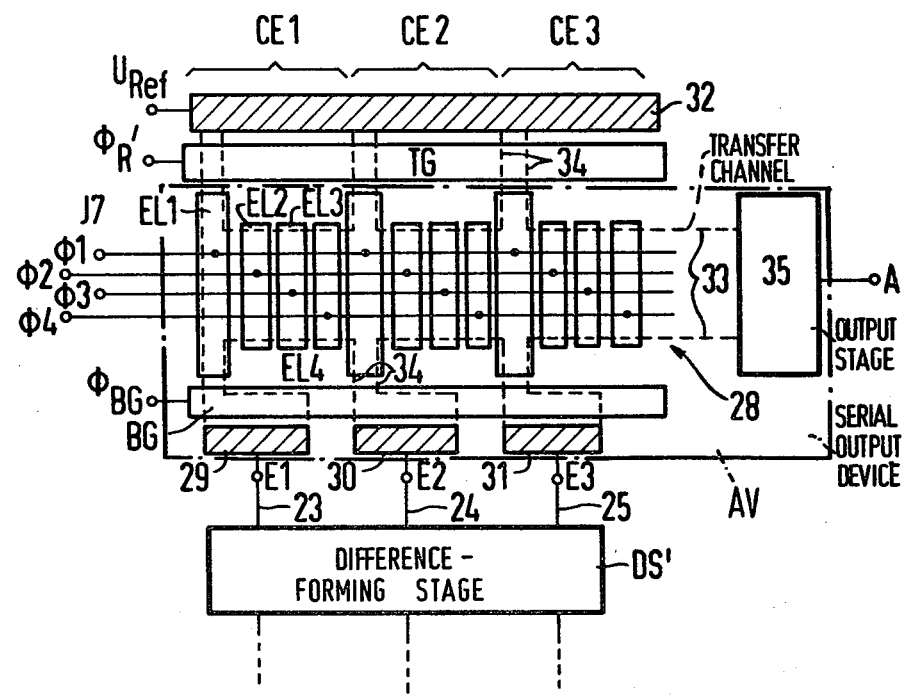
FIG. 4 is a detailed schematic circuit diagram of the serial output device shown in FIG. 1.

A first embodiment of the serial output device AV is shown in FIG 4. In that embodiment, the device AV is shown connected to a difference-forming stage DS' which is identical to the stage DS shown in FIG. 1 with the exception that the transistors S1, S2 and S3 have been eliminated and in their place a reset means consisting of a gate TG and an oppositely doped region 32 is utilized, whose operation will be explained in greater detail below. It will be understood that the reset means consisting of transistors S1, S2 and S3 could be equally as well employed in the embodiment shown in FIG. 4 which would then not require the use of the gate TG and the region 32.

In the embodiment shown in FIG. 4, the serial output device AV includes a charge transfer device generally referenced at 28 which consists of a series of transfer electrodes disposed on the insulation layer 1b. The device 28 has a number of transfer stages, three of which are shown in FIG. 4 referenced at CE1, CE2 and CE3. Each transfer stage contains four transfer electrodes respectively supplied with clock pulse voltages $\phi1$, $\phi2$, $\phi3$ and $\phi4$. Only the transfer electrodes for the first transfer stage CE1 are individually referenced, with those transfer electrodes being identified in succession at EL1, EL2, EL3 and EL4. One transfer electrode for each transfer stage is extended beyond the transfer channel indicated by the dashed lines 33. The extended electrode for each stage is on one side adjacent to a gate BG and is adjacent on the opposite side to a gate TG. Both gates BG and TG are disposed on the insulation layer 1b and are connected at their respective terminals to clock pulse voltages $\phi_{BG}$ and $\phi_{R'}$. Semiconductor transfers regions indicated by the dashed lines 34 extend beneath both gates. The dashed lines 33 and 34 represent the boundaries of thin film zones of the insulation layer 1b lying between the lines with the external regions consisting of thick film zones. Three oppositely doped semiconductor regions 29, 30 and 31 respectively connected to the inputs E1, E2 and E3 are disposed next to the gate BG, and an oppositely doped semiconductor region 32 is disposed next to the gate TG and is connected at a terminal to the voltage $U_{Ref}$. The device 28 has a charge transfer device output stage 35 of the type known in the art connected to the output terminal A.

Operation of the serial output device AV will be described in conjunction with the voltages illustrated in FIG. 3. Again, a detailed operational description will be undertaken only for the signal entering at the input E1, however, it will be understood that an identical operation is undertaken for each of the other inputs. Given a voltage signal $U_a$ pending at the input E1, a charge packet dependent upon the voltage $U_a$ is generated in the oppositely doped region 29 and is transferred therefrom, by the occurrence of a clock pulse $\phi_{BG1}$ supplied to the gate BG, beneath the first transfer electrode EL1 of the stage CE1. The gate BG operates as a barrier gate and transfer is dependent upon the amplitude of the pulses in the voltage $\phi_{BG}$. This results in a corresponding voltage rise 36 at the capacitor electrode 17. This charge amount is further transferred, as well as charge packets also read into the other transfer stages follows by the successive operation of the clock pulse voltages $\phi1$ through $\phi4$ as indicated in FIG. 3 by the time span ZD and by the narrow pulses $\phi1$. Until the beginning of this further transfer, a voltage signal $\phi11$ is connected at the terminal 37 of the charge transfer device 28.

Finally, the zero signal charge situated in the capacitor Ko1 is transferred by the occurrence of the pulse $\phi_{T22}$ into the zone 21 which results in a further voltage rise 36a at the electrode 17.

The first readout operation is referenced at AL1 in FIG. 3. At the beginning of the next readout operation, referenced at AL2, the electrode 17 is reset to the voltage $U_{Ref}$ by means of the pulse $\phi_{R2'}$ and, under certain conditions, by the pulse $\phi_{BG2}$.

At the beginning of the next readout operation, the pulse $\phi_{R2'}$ supplied to the gate TG resets the capacitor electrodes to the potential $U_{Ref}$ connected to the oppositely doped region 32.

Figure 5:
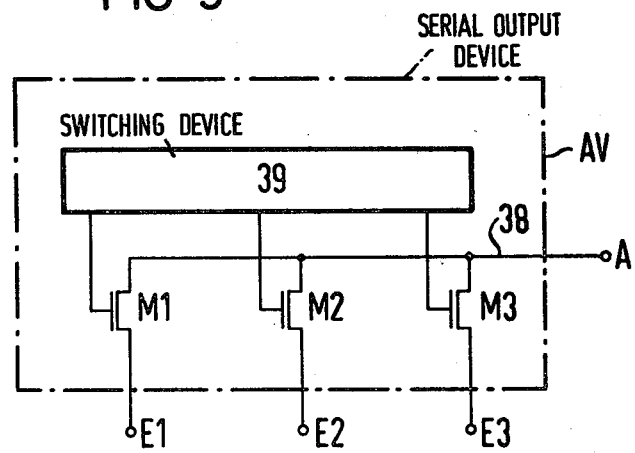
FIG. 5 is a second embodiment of the device shown in FIG. 4.

Another embodiment of the serial output device AV is schematically illustrated in FIG. 5 which consists of a readout line 38 which may consist, for example, of a metallic strip or a strip formed of highly doped polycrystalline silicon or a re-doped, strip-like semiconductor zone (diffusion line). The inputs E1 through E3 are connected to the readout line 38 through the source-drain segments of multiplex transistors M1, M2 and M3 which have their respective control electrodes connected to the output of a switching device 39. The switching device 39 may, for example, be an address decoder or a digital shift register and respectively individually switches the multiplex transistors into conductive states in succession. The voltage $U_a$ pending at the input E1 is thereby transmitted to the output A upon the switching of the transistor M1 to a conducting state, and an identical readout for the inputs E2 and E3 occurs in succession.

In the embodiments discussed above, the semiconductor body 1 was designated as p-conductive and the potentials and voltage specified respectively exhibit positive operational signs in comparison to the reference potential of the circuit. If the conductivity types of the individual semiconductor regions are reversed, then the operational signs of the voltages and potentials may likewise be inverted without departing from the inventive concept disclosed herein.

Moreover, although the charge transfer device arrangement discussed above is of the type known as a surface charge coupled device (SCCD), the inventive concept disclosed herein can be equally as well achieved with charge transfer devices of any known type as described in the text by Sequin and Tompsett identified above. Such charge transfer devices may function in two-, three-, four- or multiphase operation.

The time span referenced at ZD in FIG. 3 represents a line duration for a standard television device. During this time span, the sensor signals derived from a sensor line are emitted at the output A as a result of the clock pulse voltages $\phi 1$ through $\phi 4$. The same time span is required by an electron beam of a visual display means controlled by the further-processed sensor signals in order to inscribe an image line. The time span AL1 corresponds to the blanking gap. In this time span, an electron beam inscribing the line signal in a reproduction means is blanked out and conducted from the end of the line just inscribed to the beginning of the next line. In standard television devices, the time span ZD is 52 $\mu$s and the time span AL1, as well as the time span AL2, is 12 $\mu$s.

Although modifications and changes may be suggested by those skilled in the art it is the intention of the inventors to embody within the patent warranted hereon all changes and modifications as reasonably and properly come within the scope of their contribution to the art.

We claim as our invention:

1. A monolithically integrated two-dimensional image sensor having a difference-forming stage, said image sensor having a plurality of sensor elements disposed in rows and columns on a doped semiconductor body, with all sensor elements in a column being connected to a common column line selectively connectable to a reference potential, and with all sensor elements in a row being connected to a common row line connected to a means for selectively energizing all sensor elements in a row for collection of radiation incident on said sensor elements, said difference-forming stage comprising:

a plurality of first oppositely doped regions in said semiconductor body respectively connected to said column lines for generating a charge packet corresponding to respective voltages on said column lines;

a plurality of storage capacitors formed by respective electrodes disposed above an insulating layer on said semiconductor body, each column line having a storage capacitor associated therewith;

a first transfer gate having a clock pulse voltage connected thereto disposed on said insulating layer on said semiconductor body between said first oppositely doped regions and said storage capacitors;

a second oppositely doped region in said semiconductor body connected to a supply voltage;

a second transfer gate disposed on said insulating layer on said semiconductor body between said storage capacitors and said second oppositely doped region, said second transfer gate connected to a clock pulse voltage;

a reset means for resetting said electrodes of said storage capacitors to a reference potential after a readout operation; and a serial output device having a plurality of inputs respectively connected to said electrodes of said storage capacitors for sequentially reading out signals from said electrodes, whereby first charge packets are generated in said first oppositely doped regions during a first readout of said sensor elements and said first charge packets are transferred by said first transfer gate into said storage capacitors while the electrodes of these are at said reference potential, the storage capacitors being subsequently disconnected from the reference potential and the first charge packets being transferred then into said second oppositely doped region by said second transfer gate, and whereby second charge packets are generated in said oppositely doped regions by a second readout of said sensor elements and are transferred into said storage capacitors and the voltage of said electrodes of said capacitors corresponding to the difference between said first and second charge packets is subsequently output by said serial output device and said second charge packets are subsequently transferred into said second oppositely doped region by said second transfer gate.

2. The image sensor of claim 1 wherein said serial output device comprises:

a charge transfer device having a plurality of transfer electrodes disposed above a transfer channel and is divided into transfer stages each having an identical number of transfer electrodes with one transfer electrode in each transfer stage extending beyond both sides of said transfer channel;

a plurality of third oppositely doped regions in said semiconductor body respectively connected to said inputs of said serial output device for generating a charge packet corresponding to respective voltages appearing at said inputs; and a barrier gate disposed between said third oppositely doped regions and said extended electrodes of said charge transfer device connected to a clock pulse voltage for transferring charge from said third oppositely doped regions to beneath said extended transfer electrodes, whereby charge packets respectively transferred beneath said extended electrodes are sequentially transferred in said transfer channel by the sequential application of clock pulse voltages to said transfer electrodes.

3. The image sensor of claim 2 further comprising:

a fourth oppositely doped region connected to a reference potential;

a third transfer gate disposed between said fourth oppositely doped region and said extended transfer gate electrodes and connected to a clock pulse voltage, whereby at an end of a readout operation said third transfer gate is supplied with a clock pulse for resetting said electrodes of said capacitors to said reference potential.

4. The image sensor of claim 1 wherein said reset means is a plurality of transistors respectively interconnected between a reference potential and said electrodes of said capacitors each transistor having a control electrode connected to a clock pulse voltage for selected connection of said electrodes of said capacitors to said reference potential.

5. The image sensor of claim 1 wherein said serial output device is comprised of:
   a plurality of multiplex transistors respectively interconnected between said inputs and an output of said serial output device, each multiplex transistor having a control electrode; and
   a switching means connected to each control electrode of said multiplex transistors for sequentially switching respective ones of said multiplex transistors to a conducting state such that a signal appearing at an input is transmitted to said output of said serial output device.

6. A method for forming a difference signal between successive readouts of an image sensor monolithically integrated on a semiconductor substrate having a plurality of sensors elements disposed in rows and columns on said substrate, first and second oppositely doped regions in said semiconductor substrate, first and second transfer gates, and a plurality of storage capacitors, comprising the steps of:
   energizing a row of sensor elements for a first readout thereof;
   generating a first charge packet in said first oppositely doped region for each sensor element column corresponding to respective voltages generated during said first readout;
   transferring said first charge packet into said storage capacitors via said first transfer gate;
      said storage capacitors being kept at a reference potential during this transferring step, and subsequently transferring said first charge packets from said storage capacitors into said second oppositely doped region after bringing said storage capacitors into a floating condition,
   energizing said sensor elements for a second readout thereof;
   generating a second charge packet in said first oppositely doped region for each sensor element column corresponding to respective voltages generated during said second readout;
   transferring said second charge packet into said storage capacitors via said first transfer gate, whereby a corrected signal voltage corresponding to the difference between said first and second charge packets is present at respective external electrodes of said storage capacitors;
   sequentially transferring said respective corrected signal voltages to a circuit output;
   transferring said second charge packets from said storage capacitors into said second oppositely doped region via said second transfer gate; and
   resetting said electrodes of said storage capacitors to a referece potential.

7. The method of claim 6 wherein the step of transferring said respective voltages from said storage capacitors to a circuit output is further defined by the steps of:
   generating a plurality of corrected signal charge packets in respective third oppositely doped regions in said semiconductor substrate corresponding to said respective voltages from said storage capacitors;
   transferring said corrected signal charge packets into a charge transfer device via a barrier gate disposed between said charge transfer device and said third oppositely doped regions; and
   transferring said corrected signal charge packets in said charge transfer device to a charge transfer device output stage connected to said circuit output for sequential output thereof.

8. The method of claim 7 wherein the step of resetting said electrodes of said capacitors is further defined by the step of supplying a pulse to a third transfer gate disposed between said charge transfer device and a fourth oppositely doped region connected to a reference potential for connecting said electrodes of said storage capacitors to said reference potential through said fourth transfer gate, said charge transfer device and said barrier gate.

* * * * *